(12) United States Patent
Zhang et al.

(10) Patent No.: US 10,833,647 B2
(45) Date of Patent: Nov. 10, 2020

(54) ANALOG BANDPASS FILTERS

(71) Applicant: Chengdu Sicore Semiconductor Corp. Ltd., Chengdu (CN)

(72) Inventors: Cemin Zhang, Chino, CA (US); Qiling Zheng, Chengdu (CN); Rong Zhang, Chengdu (CN)

(73) Assignee: Chengdu Sicore Semiconductor Corp. Ltd., Chengdu (CN)

( * ) Notice: Subject to any disclaimer, the term of this patent is extended or adjusted under 35 U.S.C. 154(b) by 0 days.

(21) Appl. No.: 16/365,599

(22) Filed: Mar. 26, 2019

(65) Prior Publication Data

US 2020/0014362 A1 Jan. 9, 2020

(30) Foreign Application Priority Data

Jul. 6, 2018 (CN) .......................... 2018 1 0736346

(51) Int. Cl.
*H03H 7/01* (2006.01)
*H03H 7/19* (2006.01)
*H03H 7/20* (2006.01)

(52) U.S. Cl.
CPC ........ *H03H 7/0161* (2013.01); *H03H 7/0115* (2013.01); *H03H 7/19* (2013.01); *H03H 7/20* (2013.01)

(58) Field of Classification Search
CPC .............................. H03H 7/0115; H03H 7/0161

USPC .................................................. 333/172, 175
See application file for complete search history.

(56) References Cited

U.S. PATENT DOCUMENTS

| | | | |
|---|---|---|---|
| 6,518,859 B1 | 2/2003 | Spampinato | |
| 6,882,246 B2 | 4/2005 | Marquardt et al. | |
| 8,922,305 B2 | 12/2014 | Oran | |
| 9,166,564 B2 | 10/2015 | Koechlin | |
| 2006/0145782 A1* | 7/2006 | Liu ........................ | H03H 7/463 333/132 |
| 2014/0106698 A1* | 4/2014 | Mi ....................... | H03H 7/0115 455/307 |

* cited by examiner

*Primary Examiner* — Rakesh B Patel
(74) *Attorney, Agent, or Firm* — North Weber and Baugh LLP; Michael North

(57) ABSTRACT

Various embodiments of the invention relate to a high performance analog bandpass filter (BPF) with improved performance in suppressing parasitic passband. The BPF comprises a first loss-pass filter (LPF) coupled to a first RF port, a second LPF coupled to a second RF port, and at least one high-pass module coupled in series between the first LPF and the second LPF for band-pass tuning. A resonant circuit is composed by a shunt capacitor from the LPF, a shunt inductor from the high-pass module and a series inductor from the LPF coupled in between. Such layout empowers the LPFs triple functions: to function as a low-pass filter, to participate in resonant circuit for center frequency tuning of the BPF, and to suppress parasitic resonance. Such a triple-function of the LPFs gives the BPF an improvement in a compact but effective topology.

14 Claims, 8 Drawing Sheets

ANALOG BANDPASS FILTERS

CROSS-REFERENCE TO RELATED APPLICATIONS

This application claims foreign priority to Chinese Patent Application No. 201810736346.6, entitled "ANALOG BANDPASS FILTERS", naming Cemin Zhang, Qiling Zheng, and Rong Zhang as inventor, and filed Jul. 6, 2018, the subject matter of which is hereby incorporated herein by reference.

BACKGROUND

A. Technical Field

The present invention relates generally to analog bandpass filters, and more particularly to analog bandpass filters with low passband insertion loss and high stopband rejection level.

B. Background of the Invention

A bandpass filter (BPF) is a device that passes frequencies within a certain range and rejects (or attenuates) frequencies outside that range. A BPF may be an analog filter or a digital filter. Analog BPFs may be preferred when minimum latency and power consumption are required.

An ideal analog BPF would have a flat passband and a completely attenuation for all frequencies outside the passband. Additionally, the transition out of the passband would have brick-wall characteristics. In practice, a BPF does not attenuate signal with frequencies outside the desired frequency range completely. Sometimes, there exists a pass-region outside an intended passband where signals still pass without being attenuated significantly. For example, a BPF may be composed of a plurality of resonant circuits coupled in series, non-ideal parasitic resonance effects of one or more resonant circuits within the BPF may cause a "parasitic passband" not distant away from the intended passband. The existence of such a "parasitic passband" is not desired for many applications. Suppressing the parasitic passband may be challenging and bring more insertion loss for signals within the passband.

Accordingly, there is a need for a high performance bandpass filter that may minimize the parasitic passband without worsening insertion loss of the intended passband.

SUMMARY OF THE INVENTION

The invention relates to an analog bandpass filter that may minimize the parasitic passband without worsening insertion loss of the passband.

In some embodiments, this invention features an analog bandpass filter (BPF) comprising a first loss-pass filter (LPF) coupled to a first RF port (RF1), a second LPF coupled to a second RF port (RF2), and at least one high-pass module coupled in series between the first LPF and the second LPF for band-pass tuning. Each high-pass module comprises a coupling capacitor and a resonating circuit. The first RF port, first LPF, coupling capacitors from each module, the second LPF and the second RF port define a main (series) path for RF signal transmission, while the resonating circuit of each module couples to the main path via respective coupling capacitor as shunt path(s). In one or more embodiments, at least one resonant circuit is adjustable for resonance frequency such that the center frequency of the BPF may be adjusted. In one or more embodiments, at least one coupling capacitor is adjustable such that the bandwidth of the BPF may be adjusted. In one or more embodiments, the first LPF and the second LPF are configured such that the cut-off frequencies of both LPFs are at least above the upper cutoff frequency of the BPF.

In one or more embodiments, the LPFs are disposed right next to respective RF ports to improve port return loss. Furthermore, at least one LPF is tunable such that the rejection region of the LPF may be adjusted to track the parasitic passband to maintain an overall good stopband rejection level. In one or more embodiments, at least one LPF is configured to form a resonant circuit with a shunt inductor of a high-pass module. Such configuration ensures that the LPFs function not only as low pass filter to reject or suppress undesired high frequency signals but also as part of resonant circuits for tuning the center frequency of the BPF. Such dual functions of the LPFs give the LPFs the advantage that the rejection region of the LPF may be adjusted to follow the center frequency of BPF for an overall good stopband rejection level.

In one or more embodiments, the BPF has a symmetric topology to ensure that the BPF may have a scattering matrix with symmetrical S11/S22 (reflection coefficient) for easy design and additional usage convenience, e.g. RF input signal may be fed to the BPF from either the RF1 port or the RF2 port. Correspondently, RF output signal may be output from the BPF from either the RF2 port or the RF1 port.

In some embodiments, the BPF has at least one resonant circuit incorporating a series inductor on the main RF path to separate a shunt varactor and a shunt inductor of a high-pass module. The LPF comprises the shunt varactor and the series inductor on the main path. Such separated layout helps internal matching and limits the parasitic resonance within the shunt inductor instead of the whole resonant circuit. Furthermore, since the parasitic resonance frequency is typically higher than resonant frequency of the resonant circuit, the series inductor on the main path within each resonant circuit further suppresses any leaked parasitic resonance on the main path, given the fact that an inductor principally has a higher inductance reactance under higher frequency to suppress higher frequency signal. The separation layout (series inductor between shunt varactor and shunt inductor) empowers the LPFs triple functions to function as a low-pass filter, to participate in resonant circuit for center frequency tuning of the BPF, and to suppress parasitic resonance. Such a triple-function of the LPFs gives the BPF a significant improvement in band-pass performance in a compact but effective topology.

In some embodiments, a BPF may incorporate a choke inductor Lc in series with a biasing resistor Rbias to provide enhanced DC-RF isolation between a biasing voltage source VDC and a varactor. Such isolation provides additional protection for the VDC from RF interference. The BPF may comprise multiple biasing voltage sources such that biasing voltage for one or more varactors may be adjusted individually, independently or differently from each other. In one or more embodiments, the multiple biasing voltages may be set at different voltage levels to improve the overall IP3 (third-order intercept point). In one or more embodiments, choke inductors Lc and bias resistors may be configured to have different values for each VDC node to provide optimized DC-RF isolation performances, but be implemented in such a way to maintain circuit symmetry for the BPF. Furthermore, LPFs of the BPF may incorporate wirebond inductor Lw as part of the LPF to facilitate the input/output matching for improved performance.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment" it is intended mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Figure 1:
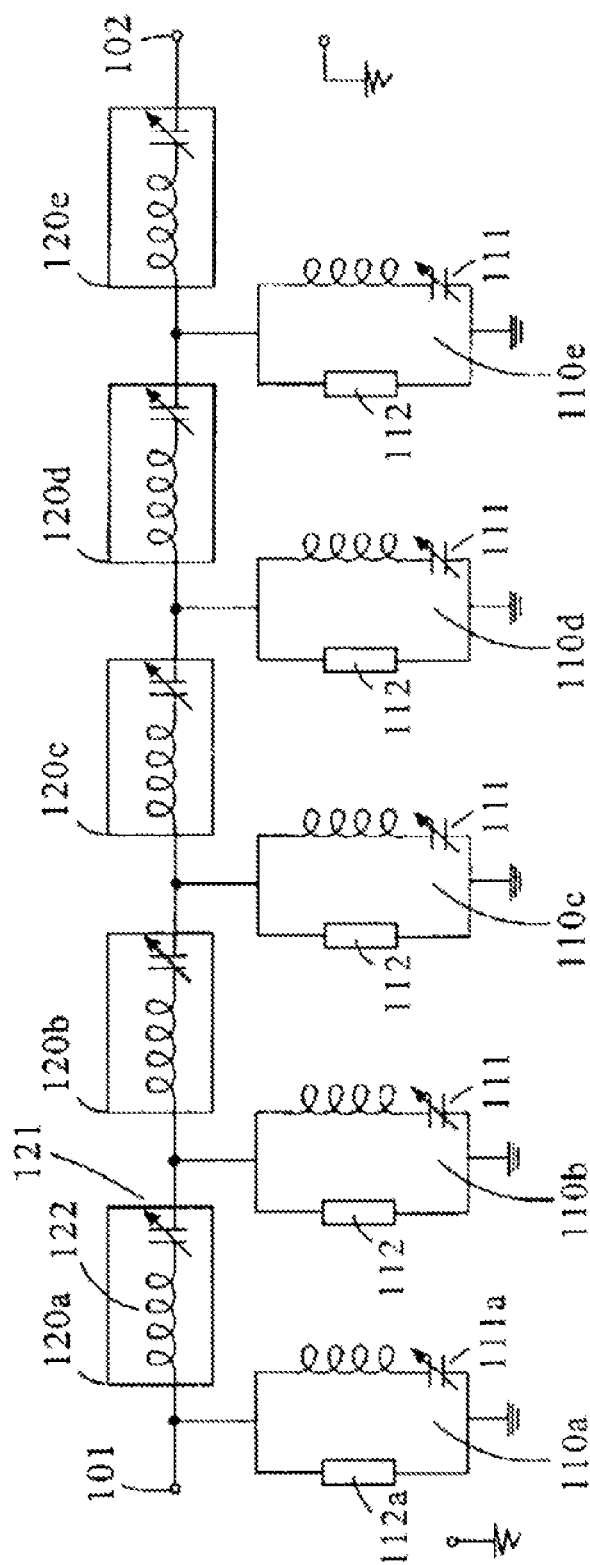
FIG. 1 depicts a prior art analog bandpass filter.

FIG. 1 depicts a prior art analog bandpass filter (BPF). The BPF, disclosed in U.S. Pat. No. 6,882,246, are composed of one or more adjustable resonant circuits 110 a-e in parallel that define the center frequency of the filter and one or more of bandwidth control circuits 120 a-e that define the bandwidth of the filter. The resonant circuits 110 a-e shown are composed of inductance elements and variable capacitance elements which allow for center frequency adjustments. Each of the bandwidth control circuits 120 a-e is comprised of inductors 122 and variable capacitance components.

Figure 2:
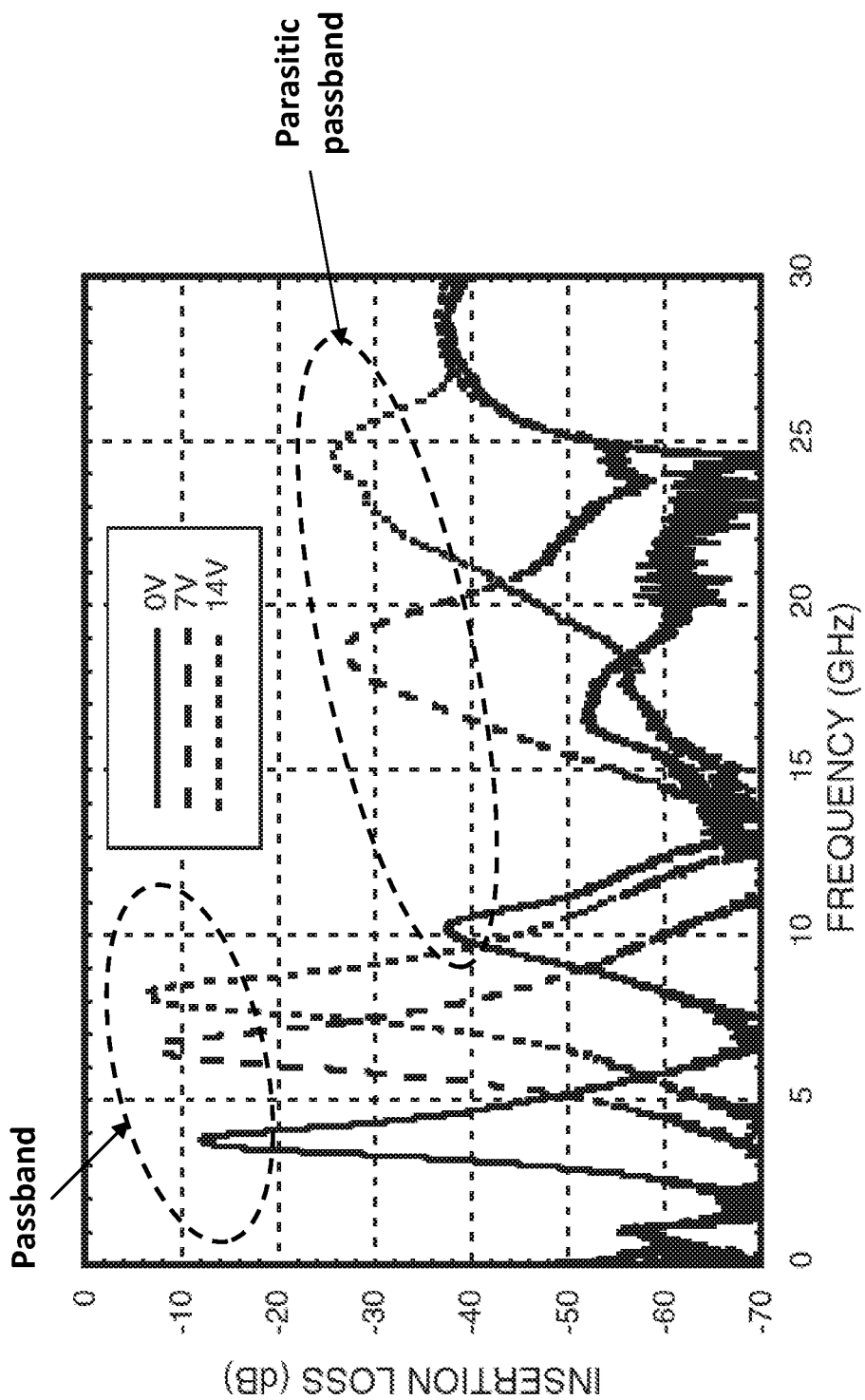
FIG. 2 graphically depicts a passband and parasitic passband for a tunable bandpass filter.

Due to non-ideal parasitic effects of the resonant circuits, e.g., parasitic capacitance of a spiral inductor, parasitic resonance at certain higher frequencies may lead to "parasitic passband" at the band rejection region of the BPF. FIG. 2 graphically depicts a passband and parasitical passband for a tunable bandpass filter HMC892 from Analog Devices. As shown in FIG. 2, the parasitic passband has a frequency range not far distant from the passband (around 2Fc~3Fc, Fc: the center frequency of passband) and is tunable together with the passband.

Figure 3:
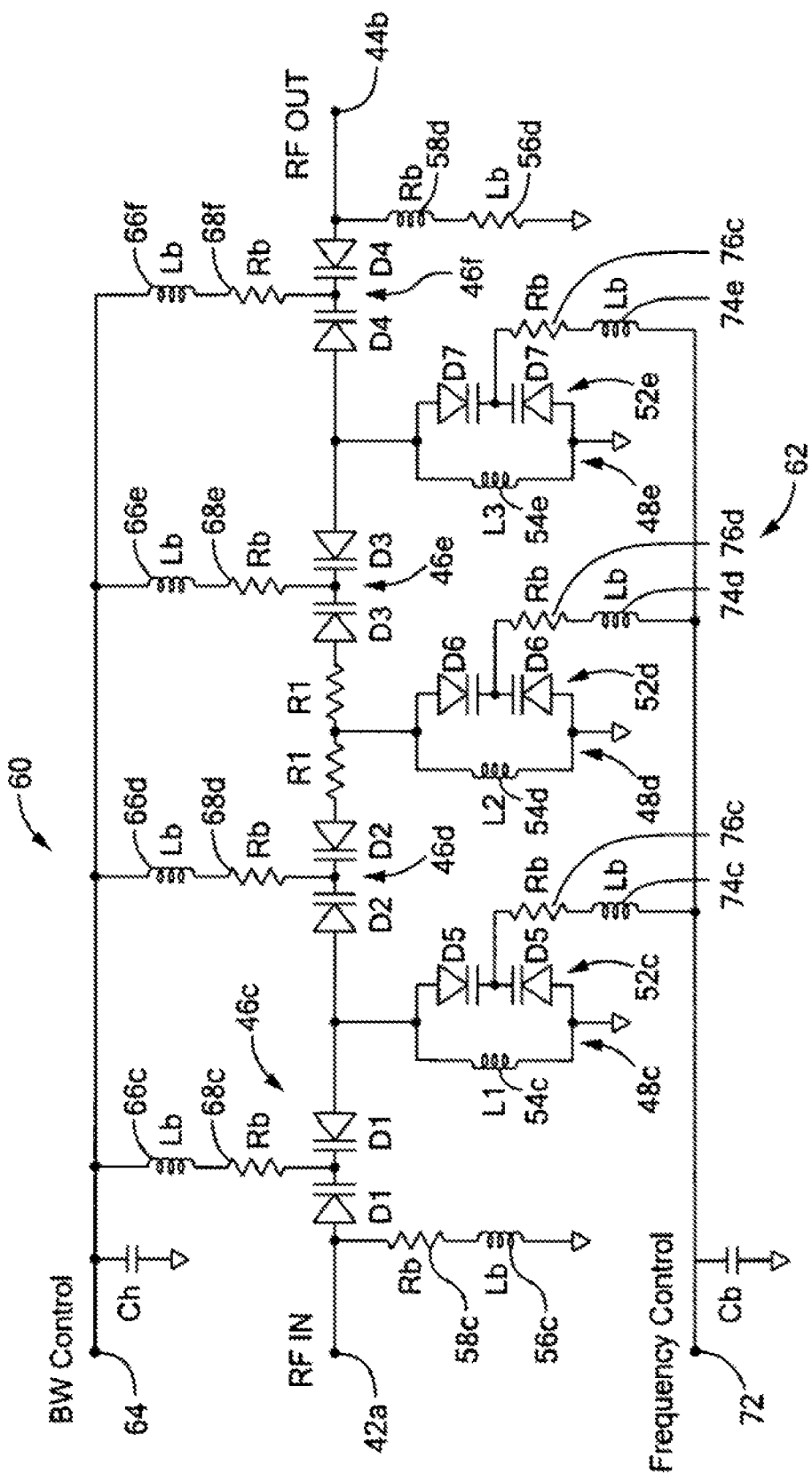
FIG. 3 depicts another prior art analog bandpass filter comprising series resistor to suppress parasitic passband.

FIG. 3 depicts another prior art analog BPF comprising series resistor to suppress parasitic passband. The BPF, disclosed in U.S. Pat. No. 9,166,564, comprises a pair of series resistors R1 on the RF IN-RF OUT path in an effort to suppress parasitic passband. However, parasitic effects of inductors L1, L2, L3 still exist. Varactors D5, D6, D7 may also introduce parasitic inductance effect. As a result, the parasitic passband problem may not be effectively eliminated. Furthermore, adding R1 in series of RF path unavoidably increases insertion loss for signal in the passband.

To address the aforementioned issues with a balance between low passband insertion loss and high out of band rejection level, the disclosed invention discloses one or more embodiments of analog BPFs to achieve low passband insertion loss and minimized parasitic passband effects, e.g., high rejection for parasitic passband if it exists, and/or pushing the parasitic passband far away from the passband center frequency (e.g., 4Fc or above).

Embodiment 1

Figure 4:
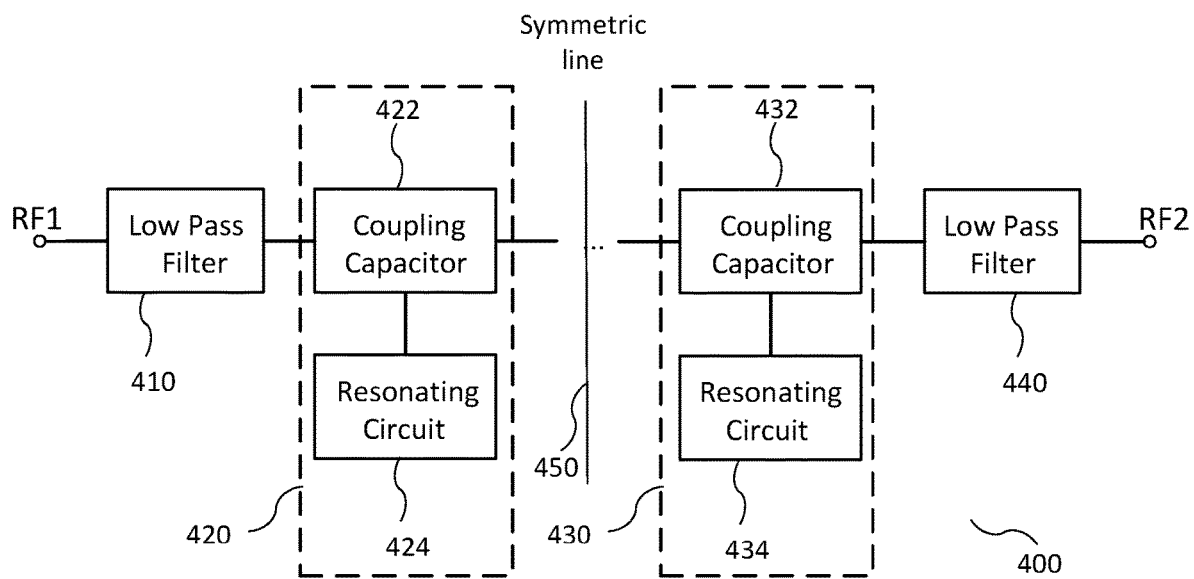
FIG. 4 depicts a block diagram of an analog BPF according to embodiment 1 of the invention.

FIG. 4 depicts a block diagram of an analog BFF 400 according to one or more embodiment 1 of the invention. The BPF 400 comprises a first loss-pass filter (LPF) 410 coupled to a first RF port (RF1), a second LPF 440 coupled to a second RF port (RF2), and at least one module (e.g. 420 and 430) coupled in series between the first LPF and the second LPF 440 for band-pass tuning. Each module comprises a coupling capacitor (e.g. 422 or 432) and a resonating circuit (e.g. 424 or 434). The first RF port, first LPF, coupling capacitors from each module, the second LPF and the second RF port define a main (series) path for RF signal transmission, while the resonating circuit of each module couples to the main path via respective coupling capacitor as shunt path(s).

The BPF 400 is operated with a passband between an upper and a lower cutoff frequencies, which are referred to the frequency points where signal is passed through the BPF with 3 dB below the maximum gain in the passband. The stopband of the BPF 400 is referred to as frequencies out of the passband. In one or more embodiments, at least one resonant circuit is adjustable for resonance frequency such that the center frequency of the BPF 400 may be adjusted. In one or more embodiments, at least one coupling capacitor is adjustable such that the bandwidth of the BPF 400 may be adjusted. In one or more embodiments, the first LPF and the second LPF are configured such that the cut-off frequencies of both LPFs are at least above the upper cutoff frequency of the BPF. LPF generally has transmission line—like topology with series inductor L and shunt capacitor C for very good high frequency rejection response. Therefore, the configuration of incorporating LPFs maximizes stopband rejection and minimizes parasitic passband effects with minimum degradation to passband insertion loss. Furthermore, disposing an LPF section right next to a respective RF port also improves port return loss. In some embodiments, at least one LPF (e.g. LPF 410 and/or LPF 440) is tunable such that the rejection region of the LPF may be adjusted to track the parasitic passband to maintain an overall good stopband rejection level.

In one or more embodiments, the BPF 400 has a symmetric topology along a virtue symmetric line 450. Such a configuration ensures that the BPF may have a scattering matrix with symmetrical S11/S22 parameters (the BPF is viewed as a 2-port network with RF1 port and RF2 port) for easy design and additional usage convenience, e.g. RF input signal may be fed to the BPF 400 from either the RF1 port or the RF2 port. Correspondently, RF output signal may be output from the BPF 400 from either the RF2 port or the RF1 port.

Embodiment 2

Figure 5:
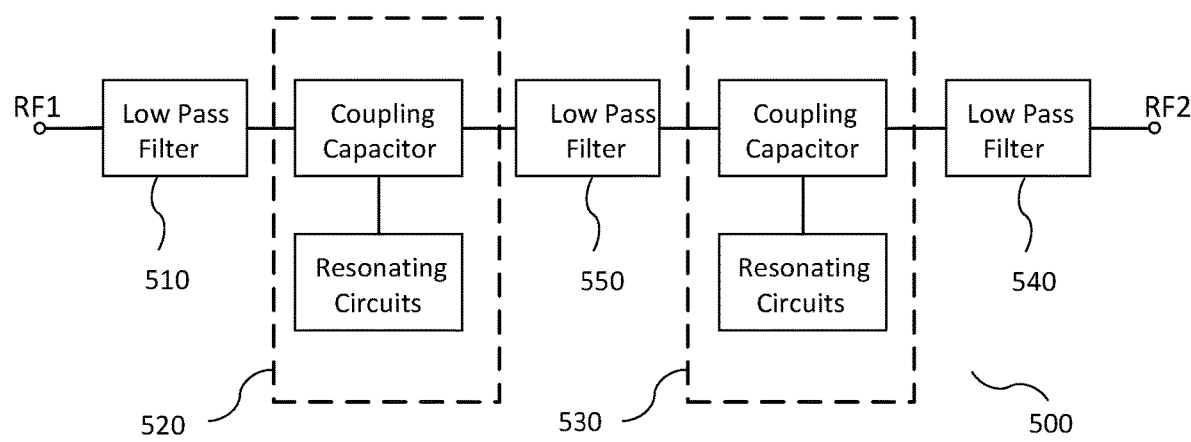
FIG. 5 depicts an alternative block diagram of an analog BPF according to embodiment 2 of the invention.

FIG. 5 depicts an alternative block diagram of an analog BPF 500 according to embodiment 2 of the invention. Similar to the BPF 400 shown in FIG. 4, the BPF 500 comprises a first LPF 510 coupled to a first RF port (RF1), a second LPF 540 coupled to a second RF port (RF2), and at least one module (e.g. 520 and 530) coupled in series between the first LPF and the second LPF 540 for band-pass tuning. Each module comprises a coupling capacitor and a resonating circuit. The aforementioned one or more embodiments with respect to BPF 400 may also be applicable to BPF 500. Compared to the BPF 400 shown in FIG. 4, the BPF 500 incorporates a third LPF 550 coupled in series between two coupling capacitors to further enhance the stopband rejection and suppress parasitic passband effects. In one or more embodiments, third LPF 550 has a symmetric structure such that the BPF 500 may also maintain a symmetrical topology for symmetrical S11/S22, e.g. RF input signal may be fed to the BPF 500 from either the RF1 port or the RF2 port.

Embodiment 3

Figure 6:
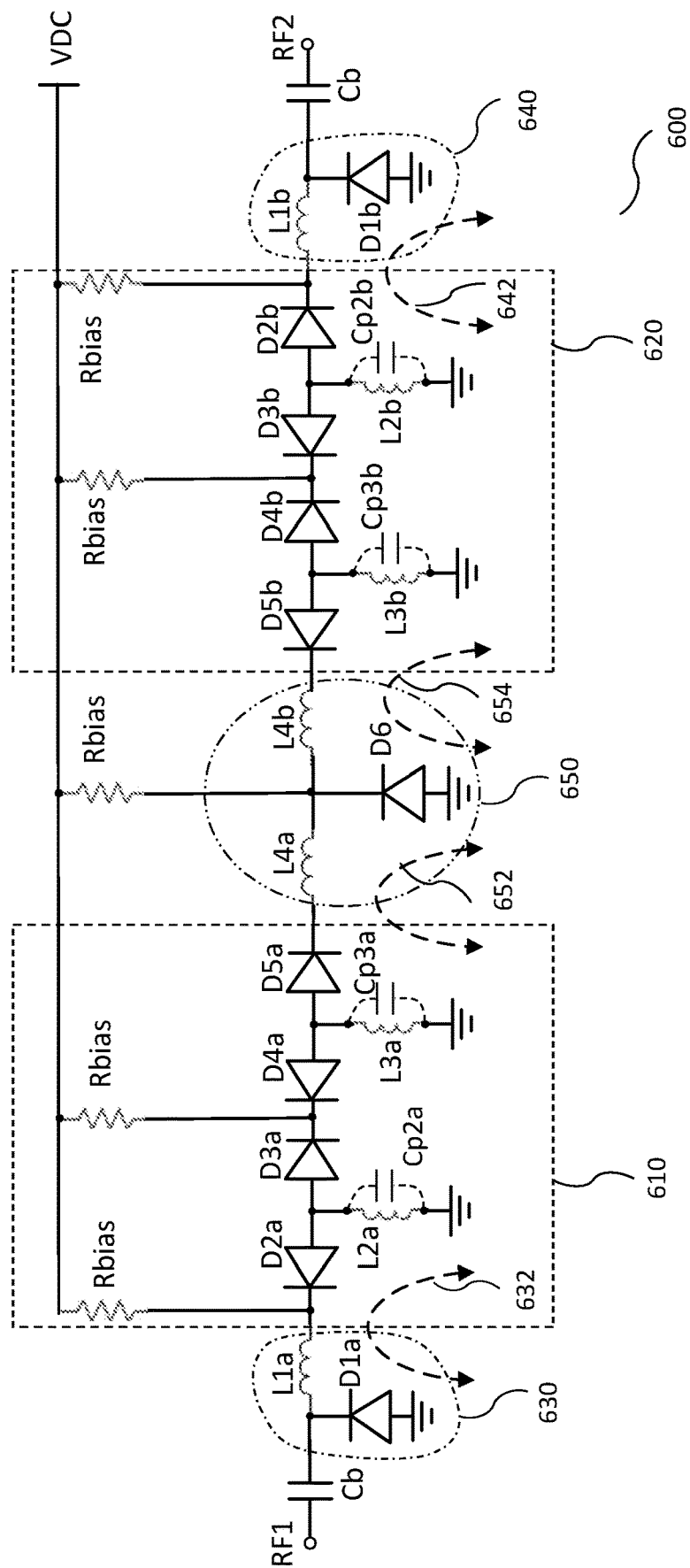
FIG. 6 depicts a schematic diagram of an analog BPF according to embodiment 3 of the invention.

FIG. 6 depicts a schematic diagram of an analog BPF 600 according to embodiment 3 of the invention. As shown in FIG. 6, the BPF 600 comprises a first module 610, a second module 620, a first LPF 630 coupled to a first RF port RF1 (preferably via a capacitor Cb for DC blocking), a second LPF 640 coupled to a second RF port RF2 (preferably via a capacitor Cb for DC blocking), and a third LPF 650 coupled in series between the first module and the second module. In one or more embodiments, each module is a high-order circuit comprising cascaded tuning stages. Each tuning stage may comprise two capacitors coupled in series and a shunt inductor coupled between the capacitors. In one or more embodiments, the capacitors are adjustable capacitors, e.g. varactors (D2a, D2b, D3a, D3b, D4a, D4b, D5a, and D5b) connected back-to-back and receive a control voltage VDC, via a biasing resistor Rbias, at the cathode terminals for capacitance adjustment. For example, the first module 610 comprises a first tuning stage (D2a-D3a-L2a) and a second tuning stage (D4a-D5a-L3a) coupled in series. The second module 620 comprises a third tuning stage (D2b-D3b-L2b) and a fourth tuning stage (D4b-D5b-L3b). The first module 610 and the second module 620 function as a high-pass filter to filter out signals at frequency below the lower cutoff frequency of the BPF passband. The capacitors of all tuning stages in the first module 610 and the second module 620 define a main (series) path for RF signal transmission between port RF1 and port RF2, while shunt inductor (L2a, L3a, L2b, L3b) of each module couples to the main path as shunt path(s).

In one or more embodiments, the first LPF 630 and the second LPF 640 are second order low pass filters, with each comprising a series inductor (L1a or L1b) on the main path and a shunt capacitor (D1a or D1b). The third LPF 650 is a third order low pass filter with a symmetric topology comprising a pair of series inductors (L4a and L4b) couples in series on the main path, and a shunt capacitor (D6) coupled between the pair of the inductors. In one or more embodiments, the shunt capacitors of all LPFs are adjustable capacitors, e.g. varactors. The capacitance value of each varactor may be adjustable via a biasing voltage coupled to the cathode terminal of the varactor. In one or more embodiments, the varactors (D1a, D1b and D6) are all coupled to the same biasing voltage VDC via a biasing resistor respectively. The biasing voltage VDC may also couple to varactors (D2a, D2b, D3a, D3b, D4a, D4b, D5a, and D5b) on the main (series) path via biasing resistors.

In one or more embodiments, the LPFs (630, 640 and/or 650) and the shunt inductors (L2a, L2b, L3a and/or L3b) of the two modules form one or more resonant paths (or resonant circuits), which may be used for tuning the center frequency of the BPF 600, while the varactors on the main (series) path (D2a, D2b, D3a, D3b, D4a, D4b, D5a, and D5b) may be used for adjusting bandwidth of the BPF 600. For example, a first resonant path 632 may be formed from varactor D1a, series inductor L1a of the first LPF 630, varactor D2a and shunt inductor L2a. Resonant frequency of the first resonant path 632 may be adjusted by adjusting the capacitance value of the varactor D1a and/or varactor D2a via the biasing voltage VDC. Similarly, a second resonant path 642 may be formed from varactor D1b, series inductor L1b of the second LPF 640, varactor D2b, and shunt inductor L2b. Resonant frequency of the second resonant path 642 may be adjusted by adjusting the capacitance value of the varactor D1b and/or varactor D2b via the biasing voltage VDC. A third resonant path 652 may be formed from varactor D6, series inductor L4a of the third LPF 650, varactor D5a, and shunt inductor L3a. Resonant frequency of the third resonant path 652 may be adjusted by adjusting the capacitance value of the varactor D5a and/or varactor D6 via the biasing voltage VDC. A fourth resonant path 654 may be formed from varactor D6, series inductor L4b of the third LPF 650, varactor D5b, and shunt inductor L3b. Resonant frequency of the fourth resonant path 654 may be adjusted by adjusting the capacitance value of the varactor D5b and/or varactor D6 via the biasing voltage VDC. Such configurations ensure that the LPFs (630, 640 and/or 650) function not only as low pass filter to reject or suppress undesired high frequency signals but also as part of resonant circuits for tuning the center frequency of the BPF 600. Such dual functions of the LPFs give the LPFs the advantage that the rejection region of the LPF may be adjusted to follow the center frequency tuning of BPF for an overall good stopband rejection level.

In one or more embodiments, the capacitance values of the series varactors (D2a, D2b, D3a, D3b, D4a, D4b, D5a, and D5b) on the main (series) path are much larger than shunt varactors (D1a, D1b and D6). For example, for a series varactor and a shunt varactor in the same resonant circuit, the series varactor is at least one order larger in capacitance than the shunt varactor. Such configuration ensures that the resonance frequency of the resonant circuit is mainly determined by the shunt varactor.

In one or more embodiments, the BPF 600 has a symmetric topology to ensure that the BPF 600 may have a scattering matrix with symmetrical S11/S22 for easy design and additional usage convenience, e.g. RF input signal may be fed to the BPF 600 from either the RF1 port or the RF2 port. Correspondently, RF output signal may be output from the BPF 600 from either the RF2 port or the RF1 port.

Due to non-ideal parasitic effects of the resonant circuits, e.g., parasitic capacitance (Cp2a, Cp2b, Cp3a, and Cp3b) of each resonant circuit (632, 642, 652 and 654), parasitic resonance at certain higher frequencies may be formed. The parasitic capacitance may come from one or more sources. For example, parasitic capacitance Cp2a may be a result of parasitic capacitance from shunt inductor L2a, from parasitic ground capacitance of varactor D2a, and/or parasitic ground capacitance of varactor D3a. The existence of parasitic capacitance Cp2a may cause a parasitic resonant path along at least the shunt inductor L2a. A parasitic resonance formed in the parasitic resonant path may be reflected into the main (series) path to induce undesired "parasitic passband". Besides the dual functions of the LPFs for the embodiment of BPF 600 shown in FIG. 6, the configurations of the LPF also have advantage in further suppressing parasitic resonance. As shown in FIG. 6, each resonant circuit (632, 642, 652 or 654) comprises a series inductor (L1a, L1b, L4a or L4b respectively) on the main path to separate the shunt varactor (D1a, D1b and D6) and the shunt inductor (L2a, L2b, L1a or L3b respectively). Such separated layout limits the parasitic resonance within the shunt inductor (mostly if not all) instead of the whole resonant circuit. Furthermore, since the parasitic resonance frequency is typically higher than resonant frequency of the resonant circuit, the series inductor on the main path within each resonant circuit further suppresses any leaked parasitic resonance on the main path, given the fact that an inductor principally has a higher inductance reactance under higher frequency to suppress higher frequency signal. Meanwhile, the shunt varactors of the LPFs further suppress the parasitic resonance through providing a bypassing path to GND around the parasitic resonance frequencies. Because one or more series inductors instead of resistors are used in the main path to suppress parasitic resonance, insertion loss for RF signals within passband is minimized. Therefore, the separation layout (series inductor between shunt inductor and shunt varactor) empowers the LPFs (630, 640 and/or 650) triple functions to function as a low-pass filter, to participate in resonant circuit for center frequency tuning of the BPF, and to suppress parasitic resonance. Such a triple-function of the LPFs gives the BPF a significant improvement in band-pass performance in a compact but effective topology.

One skilled in the art shall understand various modifications to the embodiments shown in FIG. 6 may also be applicable for a desirable BPF. For example, the modules functioning as high-pass filter may be configured to have one tuning stage only or have more than two series coupled tuning stages. Furthermore, although varactors are shown in the embodiment in FIG. 6, one skilled in the art shall understand variations of adjustable capacitors, such as switchable capacitor, a combination of switchable capacitor and varactor, etc. may also be used for capacitance adjustment to tune center frequency/bandwidth of the BPF. Such variation shall still be within the scope of this invention.

Figure 8:
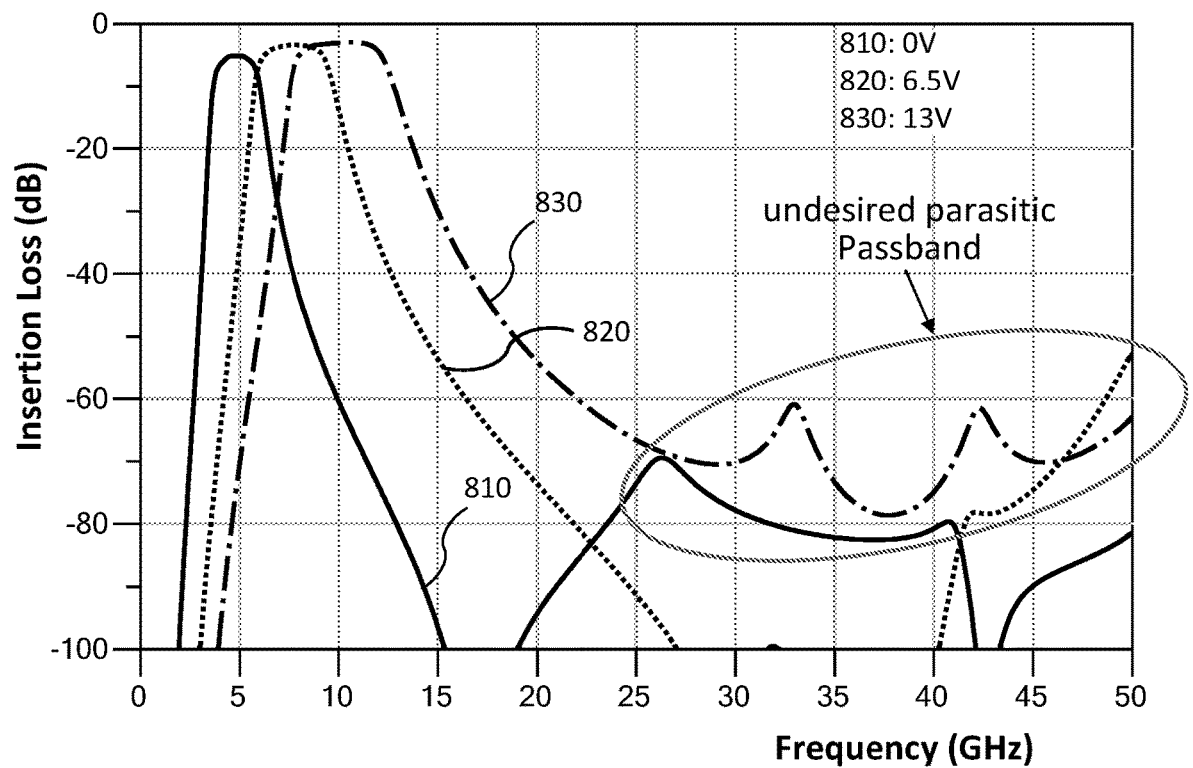
FIG. 8 depicts a simulation result of frequency response for the analog BPF according to embodiment 3 of the invention.

FIG. 8 graphically depicts a simulation result of frequency responses 810, 820 and 830 for the BPF 600 under different biasing voltages according to one or more embodiments of the invention. As shown in FIG. 8, at all biasing voltages, the undesired parasitic passband is not only suppressed to very low levels identified by the dB values, but also pushed further away from the passband. For example, the parasitic passband for frequency response 820 under 6.5V biasing voltage is even pushed to beyond 40 GHz, which is more than 4 times of the upper limit of the passband, and is suppressed to below −60 dB level.

Embodiment 4

Figure 7:
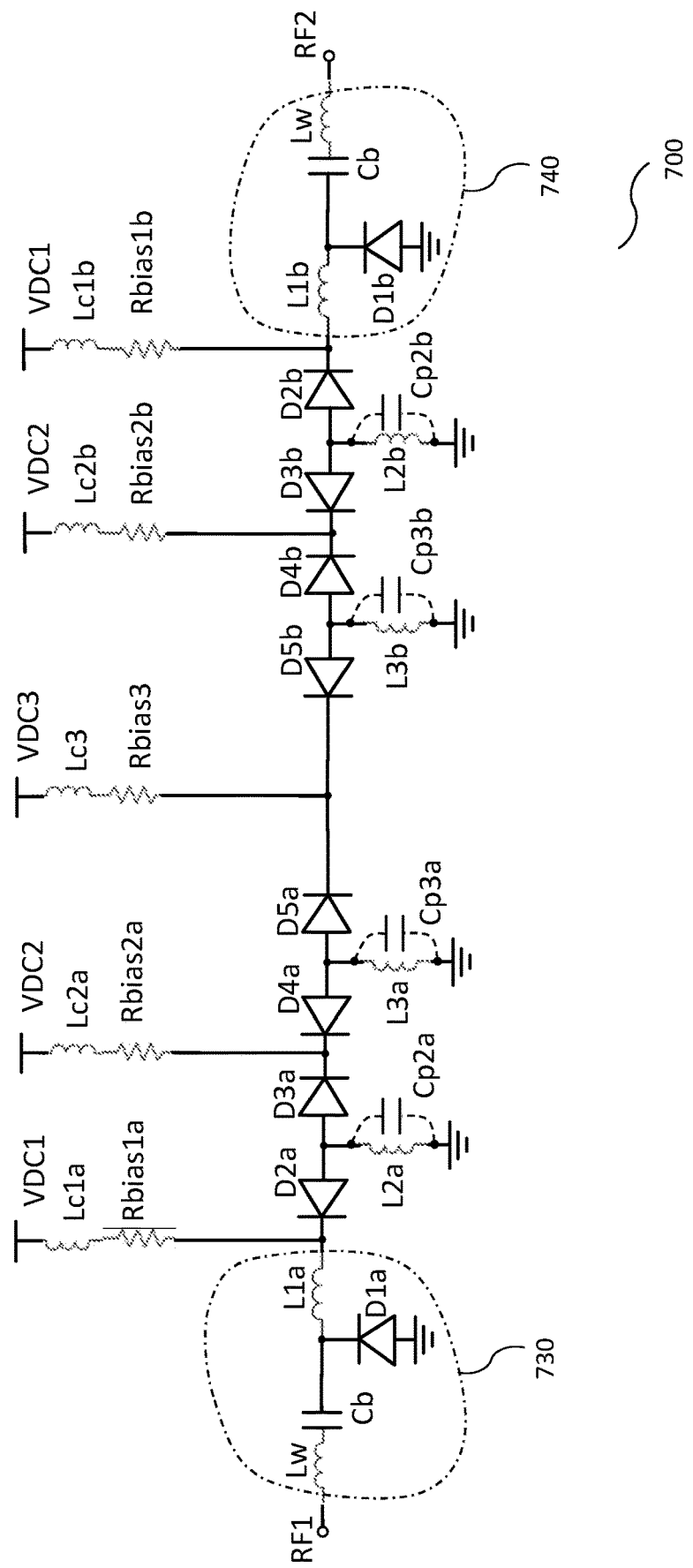
FIG. 7 depicts an alternative schematic diagram of an analog BPF according to embodiment 4 of the invention.

FIG. 7 depicts an alternative schematic diagram of an analog BPF 700 according to embodiment 4 of the invention. Compared to BPF 600 as shown in FIG. 6, the BPF 700 is quite similar, e.g. BPF 700 also comprising a first LPF 730 coupled to a first RF port RF1, a second LPF 740 coupled to a second RF port RF2. Like the LPF 630 and LPF 640 in FIG. 6, the LPF 730 and LPF 740 service triple functions to function as a low-pass filter, to participate in resonant circuit for center frequency tuning of the BPF 700, and to suppress parasitic resonance. The aforementioned one or more features of BPF 600 may also be applicable to BPF 700. Several structural differences from the BPF 600 enable the BPF 700 to have different features for alternative embodiments. First, choke inductor Lc added in series with each biasing resistor Rbias to provide enhanced DC-RF isolation between the biasing voltage source VDC and each varactor (including varactors along the series signal path between RF1 and RF2, and each shunt varactors). Such isolation provides additional protection for the VDC from RF interference. Second, instead of control biasing voltage of all varactors simultaneously via a single voltage, the BPF 700 adopts multiple biasing voltage sources, e.g. VDC1, VDC2 and VDC3, such that biasing voltage for one or more varactors may be adjusted individually, independently or differently from each other. In one or more embodiments, VDC1, VDC2, VDC3 may be set at different voltage levels to improve the overall IP3 (third-order intercept point), a well-known parameter to gauge linearity in RF functions and components. In one or more embodiments, choke inductors Lc and bias resistors may be configured to have different values for each VDC node to provide optimized DC-RF isolation performances, but be implemented in such a way to maintain circuit symmetry. For example, biasing circuit for VDC1-Lc1a-Rbias1a may have the same parameters as biasing circuit for VDC1-Lc1b-Rbias1b, but be different from biasing circuit for VDC2-Lc2a-Rbias2a. Biasing circuit for VDC2-Lc2a-Rbias2a may be the same as biasing circuit for VDC2-Lc2b-Rbias2b, but be different from biasing circuit for VDC3-Lc3-Rbias3. Furthermore, different from the LPF 630 and LPF 640, the LPF 730 and LPF 740 incorporate wirebond inductor Lw as part of the LPF to facilitate the input/output matching. As a result, the LPF 730 and LPF 740 become 3-order low pass filters.

One skilled in the art shall understand various modifications to the embodiments shown in FIG. 7 may also be applicable for a desirable BPF. For example, the order number of LPFs may be decreased or increased for variations in trade-off between passband insertion loss and stopband rejection level. Resonant circuit and coupling capacitor stages may also be increased for a faster passband to stopband transition at a cost of increased passband insertion loss. Such variation shall still be within the scope of this invention.

The foregoing description of the invention has been described for purposes of clarity and understanding. It is not intended to limit the invention to the precise form disclosed.

Various modifications may be possible within the scope and equivalence of the appended claims.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

It shall also be noted that elements of the claims, below, may be arranged differently including having multiple dependencies, configurations, and combinations. For example, in embodiments, the subject matter of various claims may be combined with other claims.

The invention claimed is:

1. An analog bandpass filter (BPF) comprising:
    a first low pass filter (LPF) coupled to a first radio-frequency (RF) port, the first LPF comprising a series inductor and a shunt capacitor; and
    a first high-pass module coupled to the first LPF, the high-pass module comprising at least one shunt inductor and at least one series capacitor, the at least one series capacitor, the series inductor and the first RF port are coupled in series to form a main path for RF signal transmission;
    wherein a resonant circuit is established from the at least one the shunt inductor from the high-pass module and the shunt capacitor from the first LPF, the resonant circuit further comprises the series inductor from the first LPF, the series inductor coupled between the at least one shunt inductor and the shunt capacitor, the resonant circuit further comprises the at least one series capacitor from the high-pass module, the at least one series capacitor coupled between the at least one shunt inductor and the shunt capacitor, the at least one series capacitor has a capacitance value larger than a capacitance value of the shunt capacitor from the LPF such that resonant circuit has a resonant frequency mainly determined by the shunt capacitor.

2. The analog BPF of claim 1, wherein the capacitance value of the shunt capacitor from the first LPF is adjustable for tuning the resonant frequency of the resonant circuit.

3. The analog BPF of claim 1, wherein the shunt capacitor and the at least one series capacitor are varactors with adjustable capacitance values.

4. The analog BPF of claim 3 wherein the varactors are both coupled to a common biasing voltage source for adjusting the capacitance values thereof.

5. The analog BPF of claim 3, wherein the varactors are coupled to multiple biasing voltage sources respectively such that a capacitance of one or more of the varactors are adjustable individually or independently from each other.

6. An analog bandpass filter (BPF) comprising:
    a first low pass filter (LPF) coupled to a first radio-frequency (RF) port;
    a second LPF coupled to a second RF port; and
    a high-pass module coupled in series between the first LPF and the second LPF;
    wherein a main series path is defined between the first RF port and the second RF port, the main series path part comprises at least part of the first LPF, part of the second LPF, and part of the high-pass module;
    wherein one or more resonant circuits are established for adjusting a center frequency of the analog BPF, the one or more resonant circuits at least partially overlap with the main series path, the one or more resonant circuits involve the high-pass module and at least one of the first and second LPFs;
    wherein the high-pass module comprises one or more tuning stages, each tuning stage comprises at least one shunt inductor and at least one series capacitor, the at least one series capacitor of each stage is on the main series path; and
    wherein each of the first LPF and second LPF comprises a shunt capacitor, the at least one series capacitor of each tuning stage has a larger capacitance value than a capacitance value of the shunt capacitor of the first LPF and a capacitance value of the shunt capacitor of the second LPF.

7. The analog BPF of claim 6, wherein the analog BPF has a symmetric topology such that the analog BPF has a scattering matrix with a symmetrical S11 and S22.

8. The analog BPF of claim 6, wherein the first LPF and the second LPF each comprises a series inductor, the series inductor of each LPF is on the main series path.

9. The analog BPF of claim 8, wherein each of the one or more resonant circuits comprises the at least one shunt inductor from the high-pass module, and the shunt capacitor from the first LPF or the second LPF.

10. The analog BPF of claim 9, wherein each of the one or more resonant circuits further comprises the series inductor from the first LPF or the second LPF.

11. The analog BPF of claim 6, wherein one or more capacitors of the BPF are adjustable in capacitance value.

12. The analog BPF of claim 6, wherein the first LPF and the second LPF each further incorporates a wirebond inductor to facilitate input or output impedance matching.

13. The analog BPF of claim 6, wherein the capacitance values of the at least one series capacitor of each tuning stage, the shunt capacitor of the first LPF, and the shunt capacitor of the second LPF are adjustable for BPF tuning.

14. An analog bandpass filter (BPF) comprising:
    a first low pass filter (LPF) coupled to a first radio-frequency (RF) port, the first LPF comprising a series inductor and a shunt capacitor; and
    a first high-pass module coupled to the first LPF, the high-pass module comprising at least one shunt inductor and at least one series capacitor, the at least one series capacitor, the series inductor and the first RF port are coupled in series to form a main path for RF signal transmission;
    wherein a resonant circuit is established from the at least one shunt inductor from the high-pass module and the shunt capacitor from the first LPF, the resonant circuit further comprises the series inductor from the first LPF, the series inductor coupled between the at least one shunt inductor and the shunt capacitor;
    wherein the shunt capacitor and the at least one series capacitor are varactors with adjustable capacitance values, the varactors are coupled to a common biasing voltage source, via a biasing resistor and a choke inductor coupled in series with the biasing resistor for DC-RF isolation between the common biasing voltage source and each varactor, for adjusting a capacitance value thereof.

* * * * *